United States Patent

Tanaka

[15] 3,695,758

[45] Oct. 3, 1972

[54] ILLUMINATION DEVICE FOR PROJECTOR TYPE IC PRINTER

[72] Inventor: Hiroshi Tanaka, Tokyo, Japan

[73] Assignee: Nippon Kogaku K.K., Tokyo, Japan

[22] Filed: June 22, 1970

[21] Appl. No.: 48,010

[30] Foreign Application Priority Data

June 30, 1969 Japan ....................44/61038

[52] U.S. Cl. ....................................355/71, 355/67

[51] Int. Cl. ....................................G03b 27/76

[58] Field of Search .........355/67, 70, 71; 353/34, 82

[56] References Cited

UNITED STATES PATENTS

| | | | |
|---|---|---|---|
| 2,590,916 | 4/1952 | Back | 355/67 X |
| 3,514,198 | 5/1970 | Schacht | 353/82 X |
| 3,462,215 | 8/1969 | Floden | 353/82 |
| 3,442,583 | 5/1969 | Rottmann | 353/34 |

*Primary Examiner*—Samuel S. Matthews
*Assistant Examiner*—Monroe H. Hayes
*Attorney*—Harry G. Shapiro

[57] ABSTRACT

An improved IC printer which projects the pattern of an integrated circuit from a mask to form an image on a wafer includes a pair of similar illuminating optical systems arranged symmetrically with respect to a single light source and which are thermally isolated therefrom. One of the illuminating optical systems is used for illuminating the wafer when aligning the mask and wafer, the other is used for illuminating the mask when projecting the pattern of the mask on the wafer.

4 Claims, 6 Drawing Figures

INVENTOR.
HIROSHI TANAKA
BY Harry G. Shapiro
ATTORNEY

INVENTOR.
HIROSHI TANAKA
BY Harry G. Shapiro
ATTORNEY

ILLUMINATION DEVICE FOR PROJECTOR TYPE IC PRINTER

This invention relates to an IC printer where IC patterns or the like are printed upon a wafer by projecting a pattern image upon the wafer.

BACKGROUND OF THE INVENTION

In prior art IC printers, the alignment operation and printing operation each needed a specific light source and illumination system. In the alignment operation, a microscope combined with an illumination device was positioned over a mask in order to observe the alignment of the mask with the wafer on which the image was to be projected. In the printing operation, another illumination device was combined with a printing light source to provide the light beam which impinged upon the mask and projected the image on the wafer. Two separate units, therefore, each of substantial weight, were alternately required for each single wafer printing. The vibrations which accompanied the switching of these units were transmitted to the mask and wafer, which made it difficult to obtain a proper clear-cut image. Additionally, providing a printer with two light sources and, therefore, two heat sources, invited a serious disadvantage, namely, a change in temperature of the mask and wafer due to conduction of heat. Furthermore, the adjustment and use of two functionally sophisticated illumination units required painstaking operation, which operation unavoidably produced large costs for operating the system.

SUMMARY OF THE INVENTION

To minimize the disadvantages referred to above, the present invention provides an IC printer with a single light source and a pair of similar illuminating optical systems arranged bi-symmetrically with respect to the light source in separate illuminating units. One illuminating optical system illuminates the wafer during the alignment of the mask with the wafer. The other illumination system illuminates the mask to print the pattern of the mask on the wafer. The illumination units housing the illuminating optical systems are connected through heat insulating connections at the back of the mask-wafer-alignment printer unit having a built-in projection lens.

Accordingly, it is an object of the present invention to provide an IC printer which has illuminating optical systems to illuminate the wafer to form an image on the mask for aligning the mask and the wafer and to print by illuminating the mask to project a pattern from the mask to form an image upon a wafer; which printer has symmetrically arranged similar illuminating optical systems for aligning the mask with the wafer and for printing the image; which illuminating optical systems are thermally isolated from the heat of the light source so that the printer will function free of any thermal distortion of the mask, wafer or image-forming optical elements, such as lenses and mirrors; which printer will provide images of ultrahigh resolving power in the order of one micron; and which printer can be operated relatively cheaply, with a minimum of time required for adjustment and printing.

BRIEF DESCRIPTION OF THE DRAWINGS

A preferred embodiment of the present invention is shown in the accompanying drawings, in which.

DESCRIPTION OF THE PREFERRED EMBODIMENT

An embodiment of the present invention will be described in detail hereinafter. First, the arrangement of the two illuminating optical systems will be described, and then the operation of these systems, for observing alignment and for printing, will be described.

Figure 1:
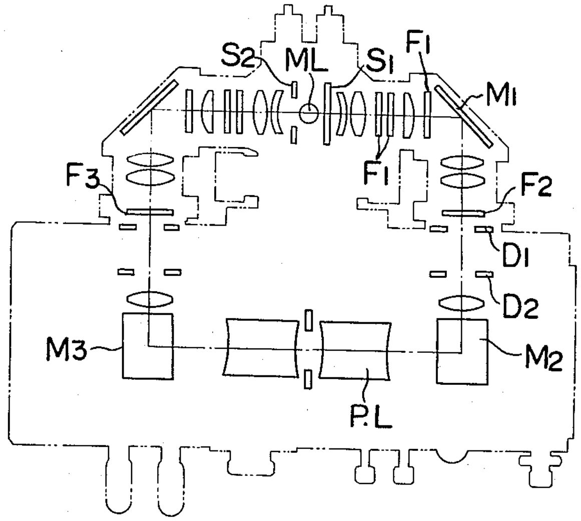
FIG. 1 is a plan view of the optical system for a projector type IC printer built in accordance with this invention.

Referring to FIG. 1, a pair of illuminating optical systems are shown, having similar elements, and disposed bi-symmetrically with respect to light source ML. The right optical system is for observation or viewing and the left optical system is for printing. The illumination elements including a set of condenser lenses, mirror M1, aperture stop D1, field stop D2, and diffusing and heat-ray absorbing filters F1, filter F2 is adapted to pass light of suitable observation wavelength for the observation side, and filter F3 is adapted to pass light of suitable printing wavelength for the printing side. Light source ML coacts with shutter S1 to provide light to the illuminating optical system for viewing and coacts with shutter S2 to provide light to the illuminating optical system for printing. These shutters are adapted to make a changeover operation, in other words to open and shut alternatively, so that when S1 is open, S2 is closed, and vice-versa, in order to permit the light beam of the light source to get into the illumination optical system for observation when viewing the alignment of the mask and the wafer, and to get into the illumination optical system for printing during the printing operation. Shutters S1 and S2 are in interlocking relation with objective lens O of microscope AM and condenser lenses C as will be referred to hereinafter.

Figure 2:
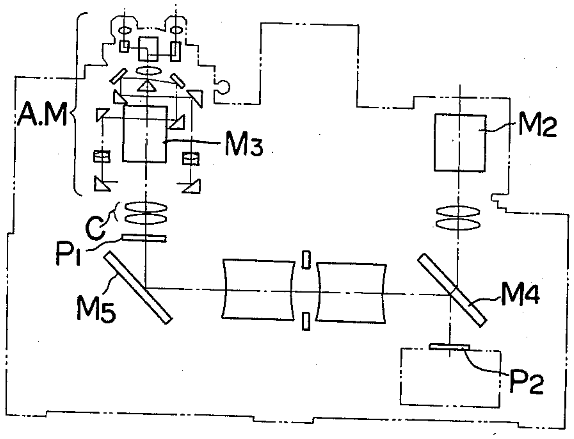
FIG. 2 is a front view of the optical system of FIG. 1, arranged for printing.
Figure 3:
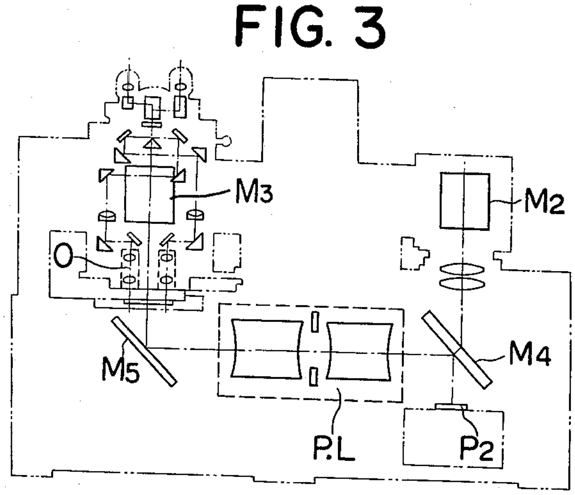
FIG. 3 is a view similar to FIG. 2 showing the optical system arranged for observation.

Referring to FIGS. 2 and 3, the elements constituting the optical system for the mask-wafer alignment projection printer unit are M2 a mirror, M4 a half-silvered or semitransparent mirror, P2 a wafer, P.L a projection lens, $M_5$ a mirror, $P_1$ a mask, C condenser lenses, AM observation microscope, O objective lens there-of, and $M_3$ a mirror. The condenser lenses C and microscope objective lens O are adapted for change-over operation in the same alternative relationship as the shutters S1 and S2. During printing, the condenser lenses C are positioned in the light path, while during observation the objective 0 is positioned in the light path. As shown in FIGS. 1 and 3, during periods of observation, the shutter S1 is open, the light beam of light source ML travels through the right illumination optical system in FIG. 1 and, travels to wafer P2 via mirror M2 and half-silvered mirror M4. The reflected light from the wafer surface forms an image on mask P1 via half-silvered mirror M4, projection lens P.L and mirror M5. The images of the mask and the wafer are observed through the objective lens 0 of microscope A.M which is interlocked with the open shutter S1.

In the printing position (see FIGS. 1 and 2), the shutter S2 is opened so that the light beam from light source ML travels through the left illumination optical system in FIG. 1 and falls upon mask P1 via mirror M3 and condenser lenses C interlocked with shutter S2, so that the image of the pattern on the mask to be printed is formed on wafer P2 via mirror M5, projection lens P.L and half-silvered mirror M4. With the optical systems arranged as described, they can be readily adjusted with high efficiency (particularly the alignment of the optical axes for the projection lens, mask, wafer and both the illumination optical systems for observation and printing respectively). In addition, the bi-symmetrical arrangement of the similar optical elements affords the advantage of easy adjustment of the lens elements for image formation, since completion of the adjustment for one optical system may establish a useful basis for adjustment of the other.

Figure 4:
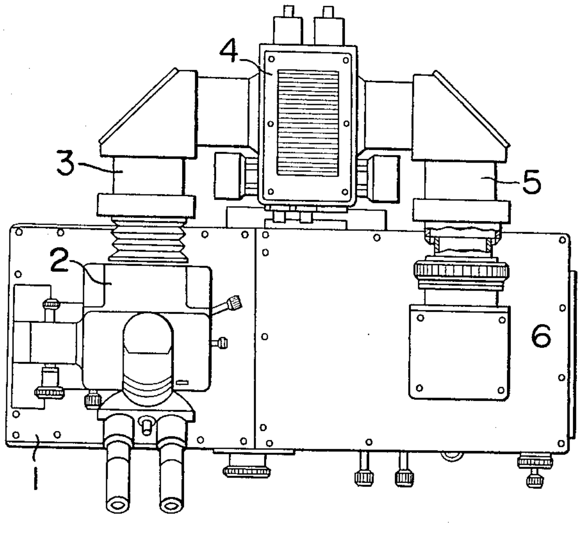
FIG. 4 is a top plan view of an embodiment of this invention.
Figure 5:
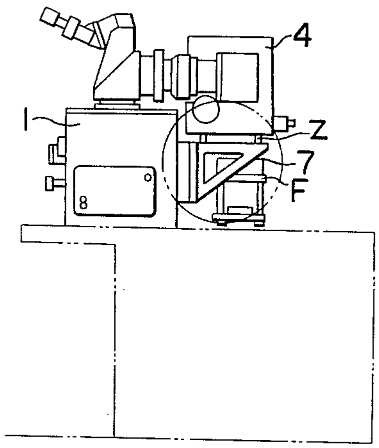
FIG. 5 is a right side view thereof.
Figure 6:
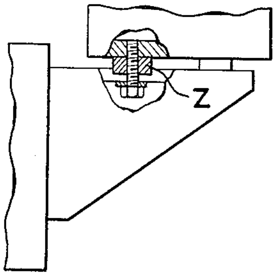
FIG. 6 is a fragmentary enlarged view of FIG. 5.

The heat insulation and vibration isolating mechanism of the printer will now be described with reference to FIGS. 4 - 6. Referring to FIG. 4, illumination units 3 and 5 respectively for printing and for observation of alignment are symmetrically arranged with respect to the lamp housing 4. To prevent transmission of heat generated from the light source to the projection printer 1, the illumination units 3 and 5 are provided with heat ray absorbing filters $F_3$ and $F_2$, respectively. The unit 3 is connected to the microscope 2 by bellows, and the unit 5 is connected to the mirror section 6 by suitable connecting means. The lamp housing 4 houses light source ML, the printing illumination unit 3 houses the printer side illumination optical system, the illumination unit 5 for observation during alignment houses the illuminating optical system for observation, microscope 2 the microscope A.M, and mirror section 6 the mirror M2. fixed arm 7 connects to projection printer 1 to the lamp housing 4 by means of four heat insulating pieces Z (FIG. 6) in order to prevent heat transmission. In addition, housing 4 is provided with a fan F for cooling the light source, which fan is positioned below the lamp housing and connected to the housing 4 by vibration isolating fasteners. Additionally, the entire apparatus is supported on a table by well-known vibration isolating mounts, such as rubber pads.

The heat insulators, the cooling fan and the vibration isolating connectors and mounts prevent deformations due to thermal expansion and vibration in the pattern of the mask and the surface of the thin wafer. These deformations would degrade the accuracy of the printing images which are required to obtain extra-high resolving power in the order of one micron accuracy.

The principles of using two differently functioning optical units positioned symmetrically with respect to one light source, can be applied to illumination devices for other optical instruments. For example, a teaching microscope including two unit microscopes, one for the students use and the other for teacher's use, may readily enable the users to obtain the correct identical illumination conditions, for example, correct settings of aperture and field stops.

What is claimed is:

1. In a device for printing an integrated circuit pattern of a mask by forming the image of the pattern on a wafer, the improvement comprising a first illumination optical system for illuminating the wafer; a second illumination optical system for illuminating the mask; a light source to impart light to each of the first and second illumination optical systems; a first shutter associated with the light source to regulate the first illumination optical system; a second shutter associated with the light source to regulate the second illumination optical system and coacting with the first shutter to provide alternative illumination by the first and second illumination optical systems; a projecting between the wafer and the mask to form the image of the illuminated wafer on the mask and to form the image of the integrated circuit pattern of the illuminated mask on the wafer; the first illuminating optical system including a filter to pass light having a wavelength suitable for observing the illuminated wafer; and a microscope associated with the mask for observing the mask and the image of the illuminated wafer thereon.

2. In a device for printing an integrated circuit pattern according to claim 1 wherein the first and second illumination optical systems each include a filter for reducing heat rays.

3. In a device for printing an integrated circuit pattern according to claim 2 wherein the first and second illumination optical systems and the light source constitute an illuminating unit; a projection printer unit including the mask, the wafer, and the lens between the wafer and the mask; and heat insulating means connecting the illuminating unit to the projection printer unit.

4. In a device for printing an integrated circuit pattern according to claim 3 wherein the first and the second illumination optical systems are disposed bisymmetrically with relation to the light source.

* * * * *

UNITED STATES PATENT OFFICE

CERTIFICATE OF CORRECTION

Patent No. 3,695,758 Dated October 3, 1972

Inventor(s) Hiroshi Tanaka

It is certified that error appears in the above-identified patent and that said Letters Patent are hereby corrected as shown below:

Column 4, line 28 after "projecting" insert -- lens --.

Signed and sealed this 13th day of March 1973.

(SEAL)
Attest:

EDWARD M.FLETCHER,JR.
Attesting Officer

ROBERT GOTTSCHALK
Commissioner of Patents